(12) United States Patent
Eldaiki et al.

(10) Patent No.: US 11,406,008 B2
(45) Date of Patent: *Aug. 2, 2022

(54) WIDEBAND TERMINATION FOR HIGH POWER APPLICATIONS

(71) Applicant: TTM TECHNOLOGIES, INC., St. Louis, MO (US)

(72) Inventors: Omar Eldaiki, East Syracuse, NY (US); Chong Mei, Jamesville, NY (US)

(73) Assignee: TTM Technologies Inc., St. Louis, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/999,969

(22) Filed: Aug. 21, 2020

(65) Prior Publication Data
US 2021/0127482 A1 Apr. 29, 2021

Related U.S. Application Data

(63) Continuation of application No. 16/705,703, filed on Dec. 6, 2019, now Pat. No. 10,772,193.

(60) Provisional application No. 62/927,593, filed on Oct. 29, 2019.

(51) Int. Cl.
*H05K 1/02* (2006.01)

(52) U.S. Cl.
CPC ........... *H05K 1/0246* (2013.01); *H05K 1/024* (2013.01); *H05K 1/0243* (2013.01); *H05K 2201/0792* (2013.01); *H05K 2201/10098* (2013.01)

(58) Field of Classification Search
CPC .... H05K 1/0246; H05K 1/0243; H05K 1/024; H05K 2201/0792; H05K 2201/10098; H05K 2201/066; H05K 1/025; H05K 1/0231; H05K 1/0233; H05K 1/0234; H01P 1/268
USPC .......................................................... 326/30
See application file for complete search history.

(56) References Cited

U.S. PATENT DOCUMENTS

| | | | | |
|---|---|---|---|---|
| 3,593,207 | A * | 7/1971 | Woermbke | H01P 5/185 333/116 |
| 5,001,524 | A * | 3/1991 | Golio | H01L 29/42316 257/280 |
| 5,212,627 | A * | 5/1993 | No | H01L 25/165 165/80.3 |
| 5,808,527 | A * | 9/1998 | De Los Santos | H01P 1/127 333/205 |
| 2007/0241834 | A1* | 10/2007 | Lee | H03B 5/1228 331/177 V |
| 2009/0244857 | A1* | 10/2009 | Tanaka | G02F 1/0123 361/748 |
| 2012/0062334 | A1* | 3/2012 | Yehezkely | H01P 5/184 333/119 |
| 2017/0019084 | A1* | 1/2017 | Mei | H03H 7/25 |

(Continued)

*Primary Examiner* — Don P Le
(74) *Attorney, Agent, or Firm* — Polsinelli PC

(57) ABSTRACT

A wideband termination circuit layout is provided for high power applications. The circuit layout may include a dielectric layer having a first surface and a second surface. The circuit layout may also include an input port disposed over the first surface. The circuit layout may further include at least two resistive film patches disposed over the first surface of the dielectric layer and a tuning line between the at least two resistive films disposed over the first surface of the dielectric layer. The at least two resistive film patches are connected in series with the at least one tuning line.

19 Claims, 10 Drawing Sheets

(56) References Cited

U.S. PATENT DOCUMENTS

| | | | |
|---|---|---|---|
| 2017/0256835 A1* | 9/2017 | Mei | H01P 3/081 |
| 2018/0367104 A1* | 12/2018 | Seebacher | H01L 24/48 |
| 2018/0374684 A1* | 12/2018 | Collins | C23C 16/4584 |
| 2019/0296413 A1* | 9/2019 | Hawn | H05K 7/2049 |
| 2019/0386613 A1* | 12/2019 | Stenman | H03L 7/099 |

* cited by examiner

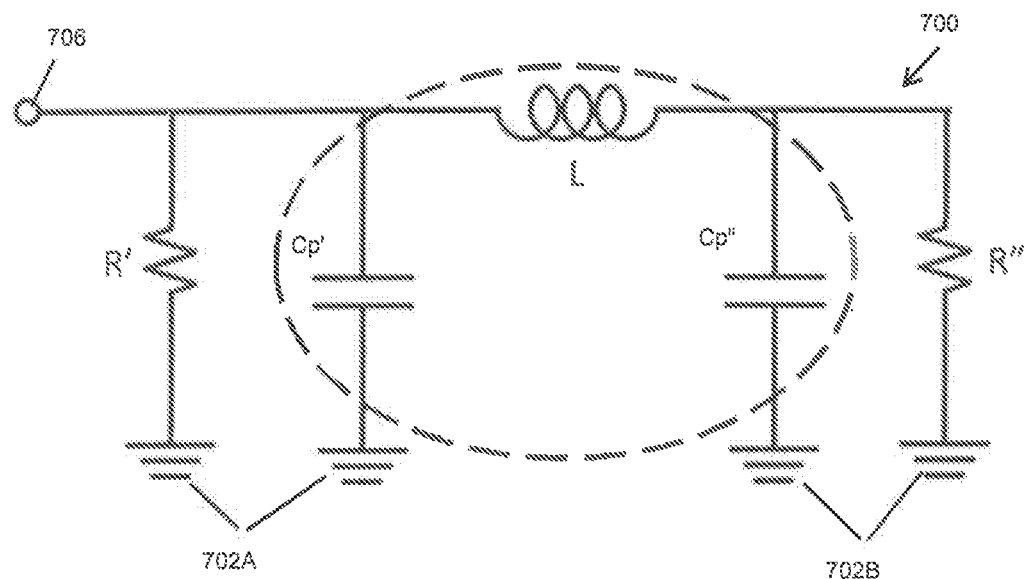
FIG. 7A
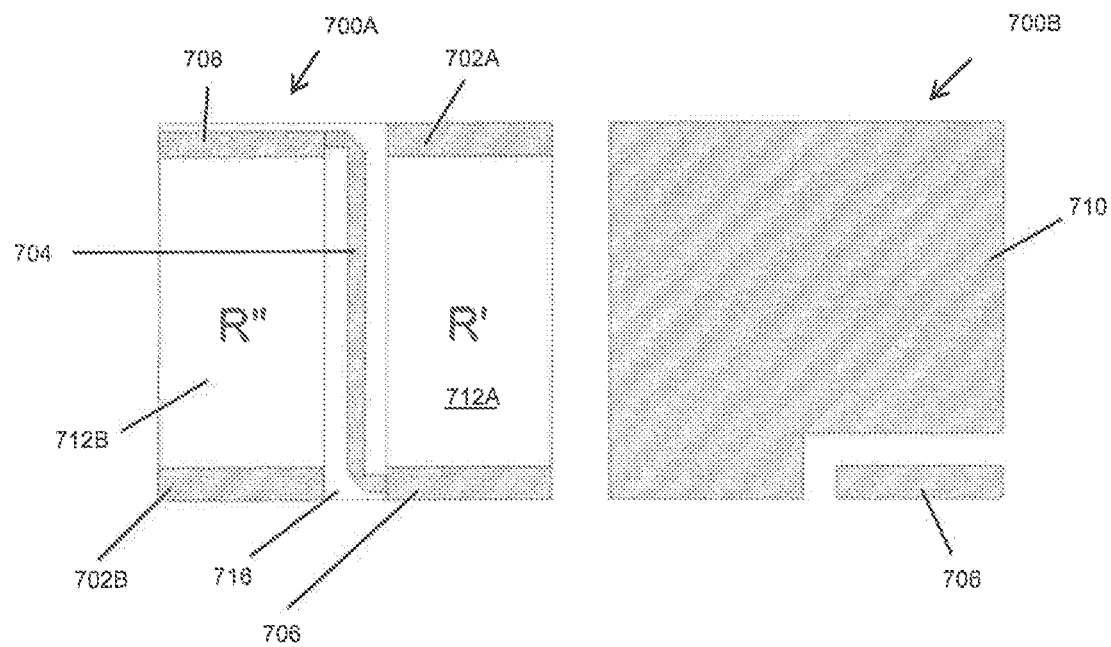
FIG. 7B
FIG. 7C

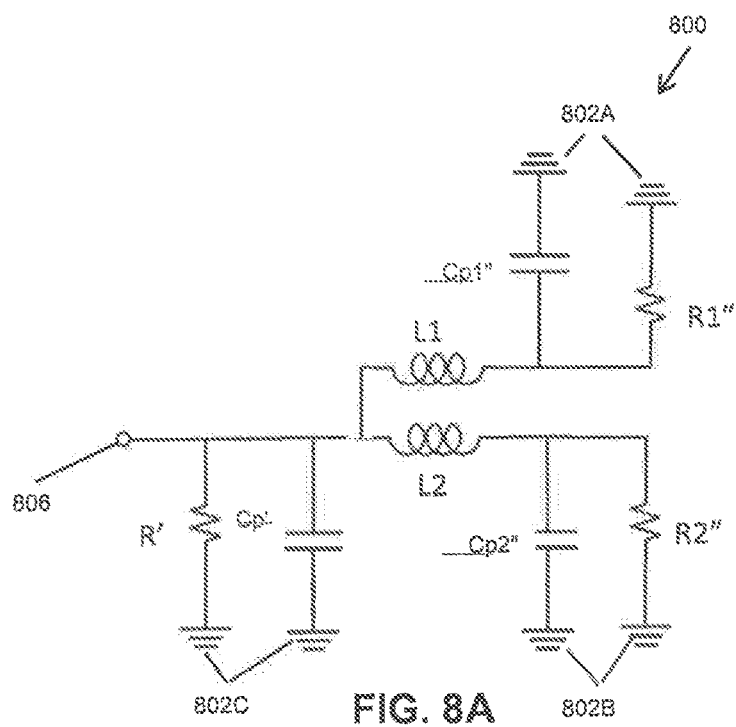
FIG. 8A
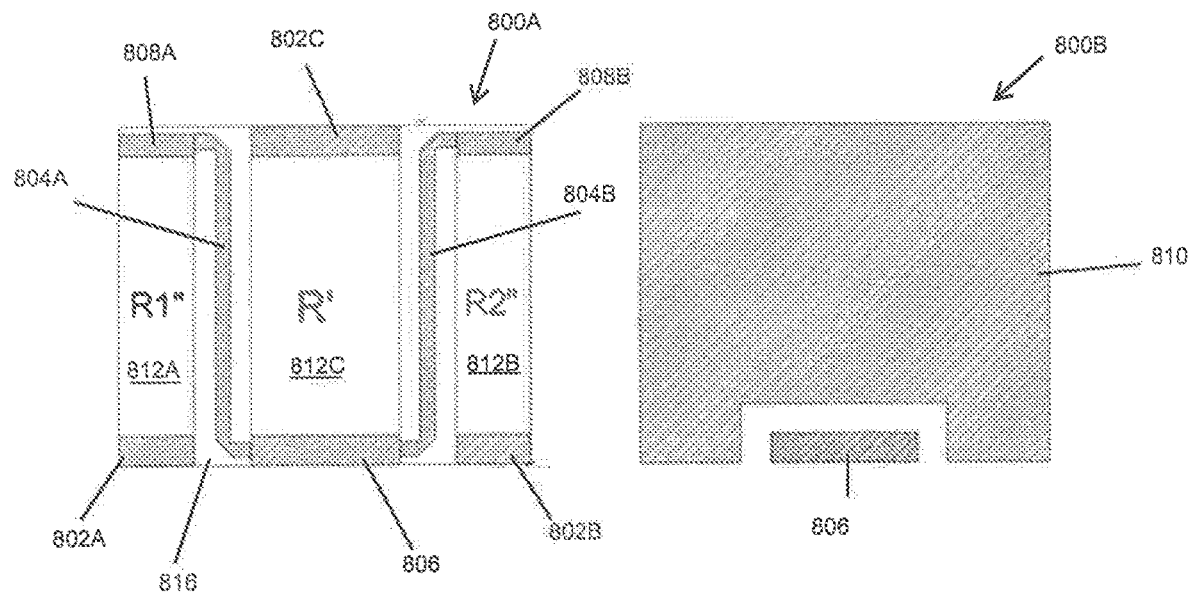
FIG. 8B
FIG. 8C

WIDEBAND TERMINATION FOR HIGH POWER APPLICATIONS

CROSS-REFERENCE TO RELATED PATENT APPLICATIONS

The disclosure is a continuation of U.S. patent application Ser. No. 16/705,703, entitled "WIDEBAND TERMINATION FOR HIGH POWER APPLICATIONS," filed on Dec. 6, 2019, which claims the benefit under 35 U.S.C. § 119(e) of U.S. Provisional Patent Application No. 62/927,593, entitled "WIDEBAND TERMINATION FOR HIGH POWER APPLICATIONS," filed on Oct. 29, 2019, each of the applications is incorporated herein by reference in its entirety.

FIELD

The disclosure is directed to wideband termination for high power applications. The wideband termination circuit can be used for wireless 5G applications.

BACKGROUND

Printed Circuit Board Assemblies (PCBAs) are formed of a Printed Circuit Board (PCB) with Surface Mount Technology (SMT) components soldered to the surface of the PCB. The SMT components dissipate power. Alternatively, a flange mount may be applied to the board. With integrated circuits (ICs) becoming more power hungry with the trend of miniaturization associated with high frequency applications, thermal management on the PCB has become a bigger challenge.

When extending or improving a 4 GHz frequency device to perform at 6 GHz or 7 GHz, conventional radio frequency (RF) termination products are not able to offer good RF performance at 4 GHz or above. For high power applications at 100 Watts or more, the conventional RF termination product can be very band limited.

BRIEF SUMMARY

In one aspect, a wideband termination circuit layout is provided for high power applications. The circuit layout may include a dielectric layer having a first surface and a second surface. The circuit layout may also include an input port disposed over the first surface. The circuit layout may further include at least two resistive film patches disposed over the first surface of the dielectric layer and a tuning line between the at least two resistive films disposed over the first surface of the dielectric layer. The at least two resistive film patches are connected in series with the at least one tuning line.

In one aspect, a wideband termination circuit is provided for high power applications. The circuit may include an input port, a first termination resistor having a first end connected to the input port and a second end connecting to a first ground and a second termination resistor having a first end and a second end connecting to a second ground. The circuit may also include a Pi impedance network or C-L-C network equivalent to an equivalent transmission line with a characteristic impedance $Z_{TL}$, and an electric length 1. The equivalent transmission line is connected between the first end of first termination resistor and the first end of the second termination resistor. The equivalent transmission line is also connected to the input port. The characteristic impedance $Z_{TL}$ is equal to the resistance of the second termination resistor at a radio frequency (RF) frequency $F_0$.

Additional aspects and features are set forth in part in the description that follows, and in part will become apparent to those skilled in the art upon examination of the specification, or may be learned by the practice of the aspects discussed herein. A further understanding of the nature and advantages of certain aspects may be realized by reference to the remaining portions of the specification and the drawings, which forms a part of this disclosure.

BRIEF DESCRIPTION OF THE DRAWINGS

The description will be more fully understood with reference to the following figures and data graphs, which are presented as various aspects of the disclosure and should not be construed as a complete recitation of the scope of the disclosure, wherein:

FIG. 7A is a schematic diagram of a first termination impedance circuit coupled to an input port in accordance with a first aspect of the disclosure;

FIG. 7B is a top view of a termination circuit layout of FIG. 7A in accordance with an aspect of the disclosure;

FIG. 7C is a bottom view of the termination circuit layout of FIG. 7B in accordance with an aspect of the disclosure;

FIG. 8A is a schematic diagram of a center-fed network termination impedance circuit coupled to an input port in accordance with a second aspect of the disclosure;

FIG. 8B is a top view of a center-fed termination circuit layout of FIG. 8A in accordance with an aspect of the disclosure;

FIG. 8C is a bottom view of the center-fed termination circuit layout of FIG. 8B in accordance with an aspect of the disclosure;

FIG. 9A is a schematic diagram of another center-fed network termination impedance circuit coupled to an input port in accordance with a third aspect of the disclosure;

DETAILED DESCRIPTION

The disclosure may be understood by reference to the following detailed description, taken in conjunction with the drawings as described below. It is noted that, for purposes of illustrative clarity, certain elements in various drawings may not be drawn to scale.

The present disclosure generally relates to wideband RF termination impedance circuits with a higher bandwidth than a conventional termination impedance circuit. There remains a need for improved thermal management in devices operating at higher frequencies, such as those operating up to 7 GHz and above. The disclosed wideband RF termination impedance circuits utilize matching technique to absorb the parasitic capacitance associated with each termination to provide wideband match at an input port.

The present disclosure also relates to termination circuit layouts for the wideband RF termination impedance circuits. The termination circuit layouts include at least two resistive film patches disposed over a dielectric layer. The disclosed termination circuit layouts are very efficient in space utilization and hence lead to cost reduction.

The disclosed RF termination device may achieve a wideband RF frequency of 3 GHz to 7 GHz or higher. High power terminations in surface mount components, such as with a flange or a chip without a flange, can be used for circulator terminations or switch terminations between a power amplifier and an antenna. The disclosed RF termination may satisfy the high power and high frequency demand of wireless 5G technology.

The RF termination can end a transmission line with a device that matches the characteristic impedance of the transmission line. This impedance match can prevent signals from reflecting off the end of the transmission line, as reflections at the ends of the transmission lines may cause signal distortion.

Figure 1A:
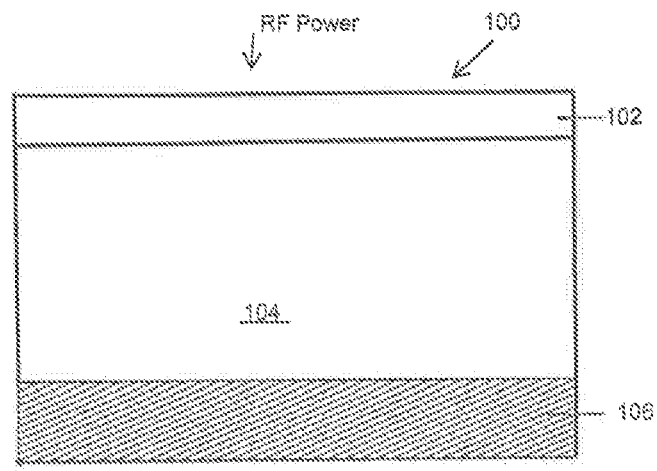
FIG. 1A depicts a schematic diagram of a radio frequency (RF) termination device in accordance with an aspect of the disclosure.

FIG. 1A depicts a schematic diagram of an RF termination device in accordance with an aspect of the disclosure. An RF termination device 100 may include a resistive film or resistive film patches 102 deposited onto a dielectric layer 104. The RF termination device 100 may also include a heat sink 106 attached to the dielectric layer 104. The resistive film 104 can convert the RF energy 108 to heat. The dielectric layer 104 may include a dielectric material, which is an electrical insulator that can be polarized by an applied electric field. The dielectric layer 104 may conduct the heat to the heat sink 106. As such, the RF termination device 100 can convert an RF energy 108 to heat, and then can dissipate the heat through the heat sink 106. Due to the limitation of the maximum temperature and power density that materials can endure, a high power can be achieved by increasing an area of the resistive film 102. The power of the RF termination is proportional to the area of the resistive film. However, an excessively large film area may be associated with a large parasitic capacitance, which in turn limits the high frequency performance.

The resistive film 102 may have a rectangular shape. When the resistive film has a rectangular layout with a length L and a width W, the resistor R has a resistance value equal to Rs*L/W, where Rs is a sheet resistance in ohms/square. In a particular aspect, when L is equal to W, the resistance R is equal to Rs. The sheet resistance is a measure of resistance for thin films that are uniform in thickness.

A parasitic capacitor $C_P$ is associated with the resistive film. The capacitance of $C_P$ is propositional to the area of the film L*W. In high power applications, the parasitic capacitance of $C_P$ may have a negative impact on achieving the RF performance in a high frequency.

Figure 1B:
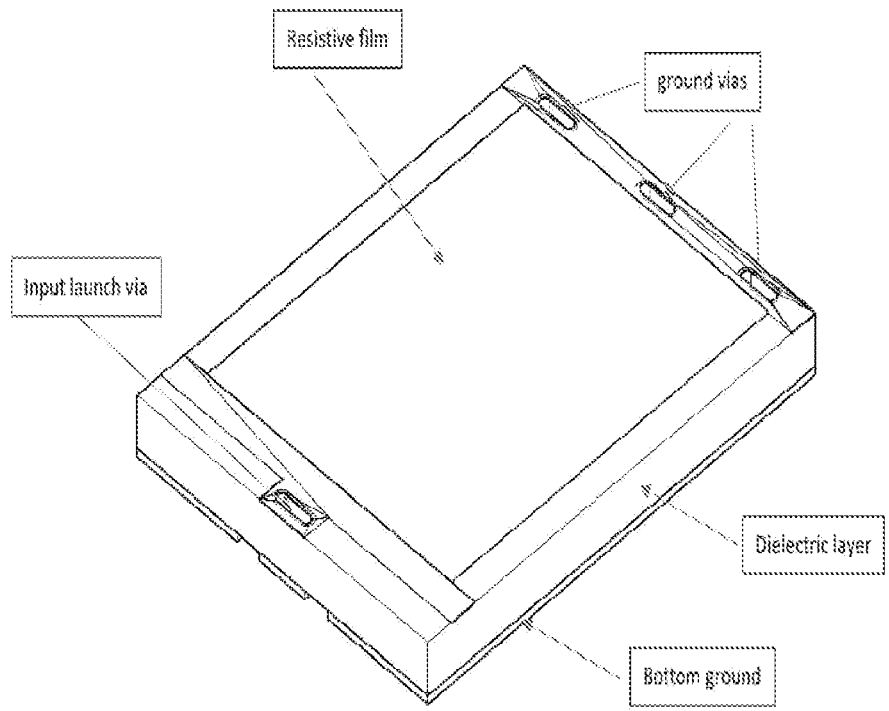
FIG. 1B depicts a perspective view of a conventional SMT termination in accordance with an aspect of the disclosure.

FIG. 1B depicts a perspective view of a conventional SMT termination in accordance with an aspect of the disclosure. As shown in FIG. 1B, the resistive film is on the top of a dielectric layer, and the ground is on the bottom of the dielectric layer. The input launch via is located on one edge, while the ground vias are located on an opposite edge to the input launch via.

Figure 1C:
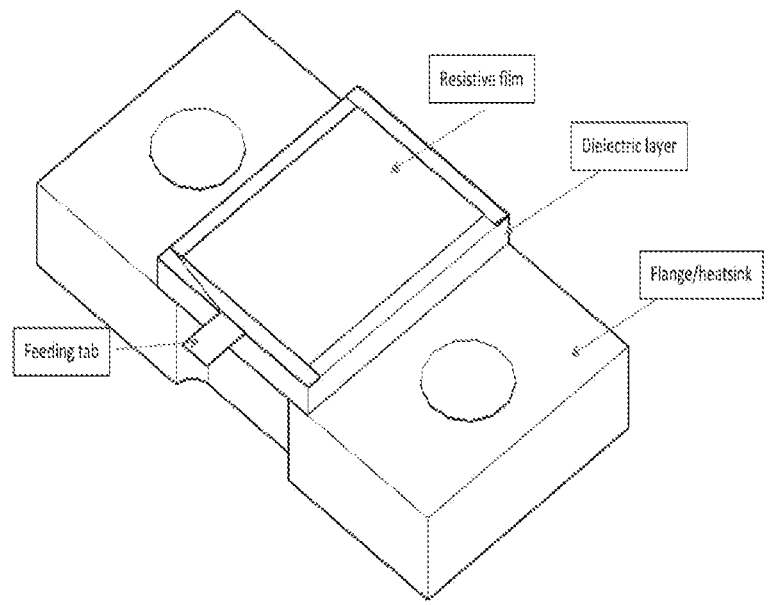
FIG. 1C depicts a perspective view of a conventional flange mount termination in accordance with an aspect of the disclosure.

FIG. 1C depicts a perspective view of a conventional flange mount termination in accordance with an aspect of the disclosure. As shown in FIG. 1C, the resistive film is on a top of a dielectric layer. A feeding tab is between the resistive film and the dielectric layer near one edge. The flange including heat sinks is at the bottom of the dielectric layer.

Figure 2:
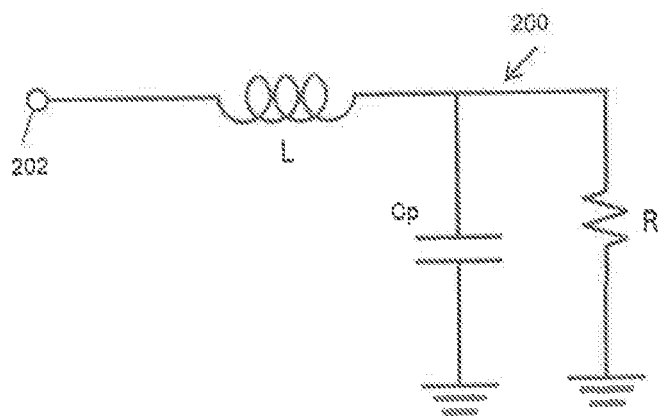
FIG. 2 is a schematic diagram of a conventional termination impedance circuit coupled to an input port in accordance with an aspect of the disclosure.

FIG. 2 is a schematic diagram of a conventional termination impedance circuit coupled to an input port in accordance with an aspect of the disclosure. As shown in FIG. 2, to improve high frequency performances, a conventional termination impedance circuit 200 includes an inductor L connected in series between an input port 202 and a resistive film characterized by a resistor R and a parasitic capacitor $C_P$. Around a designed frequency, the inductance of inductor L and the parasitic capacitance of parasitic capacitor $C_P$ may cancel out such that the termination can be achieved within a certain bandwidth.

Figure 5:
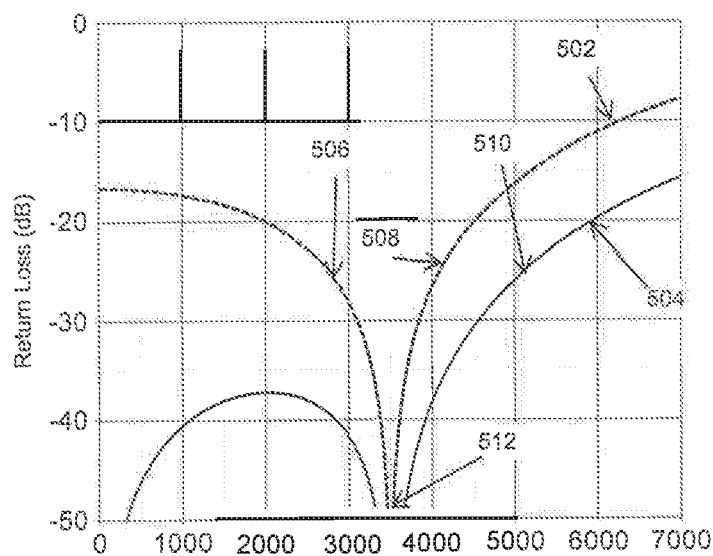
FIG. 5 is a graph of return loss versus frequency at a frequency $F_0$ of 3.5 GHz in accordance with an aspect of the disclosure.
Figure 6:
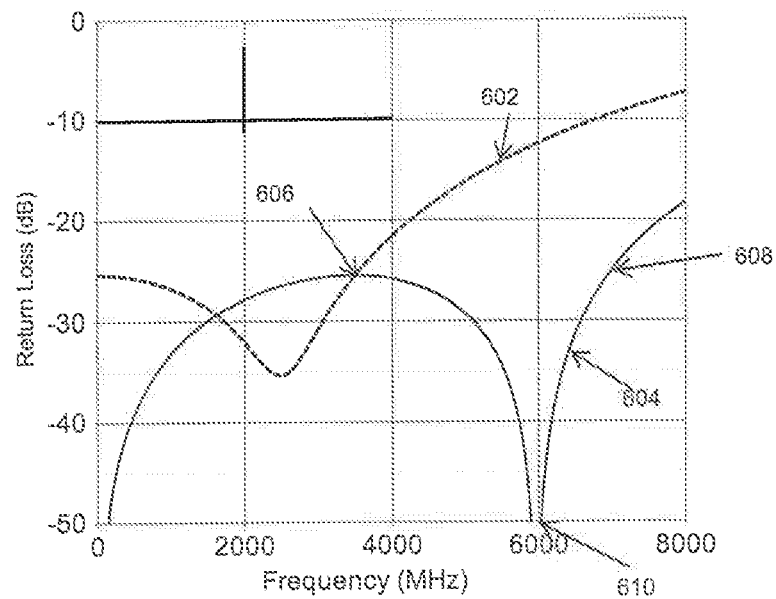
FIG. 6 is a graph of return loss versus frequency at a frequency $F_0$ of 6.0 GHz in accordance with an aspect of the disclosure.

The disclosed termination impedance circuits 300, 800, and 900 provide a higher bandwidth than the conventional termination impedance circuit 200. The disclosed termination impedance circuits include a Pi network or C-L-C network. The bandwidths were simulated for the disclosed termination impedance circuits and also the conventional termination impedance circuit. Example results are shown in FIGS. 5-6.

Figure 3:
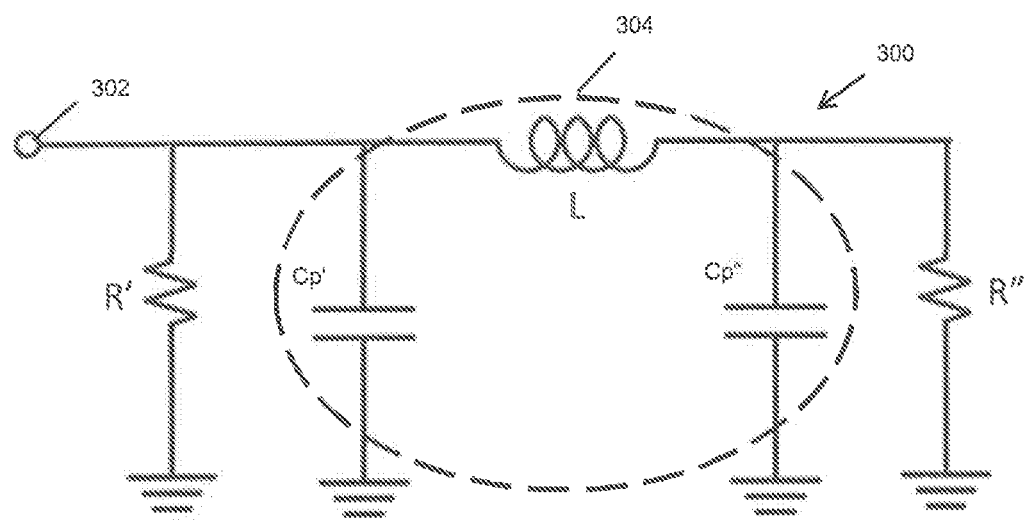
FIG. 3 is a schematic diagram of a pi-network termination impedance circuit coupled to an input port in accordance with an aspect of the disclosure.

FIG. 3 is a schematic diagram of a Pi network termination impedance circuit coupled to an input port in accordance with an aspect of the disclosure. In the Pi network termination impedance circuit 300, a resistive film is split into two halves, such that a resistor R of the resistive film is split into a first half resistor R' and a second half resistor R" in parallel such that the impedance is R'//R". An inductor L is connected with the first half resistor R' and the second half resistor R" in series. The first half resistor R' connects to a first end of the inductor L, and the second half resistor R" connects to a second end of the inductor L.

Correspondingly, the parasitic capacitor $C_P$ is split into capacitors $C_P'$ and $C_P''$. The parasitic capacitance of $C_P'$ associates with the resistance of R' and the parasitic capacitance of $C_P''$ associates with the resistance of R". The two shunt parasitic capacitors $C_P'$ and $C_P''$ and the inductor L are connected in series to form a Pi impedance network, i.e. C-L-C network.

Figure 4:
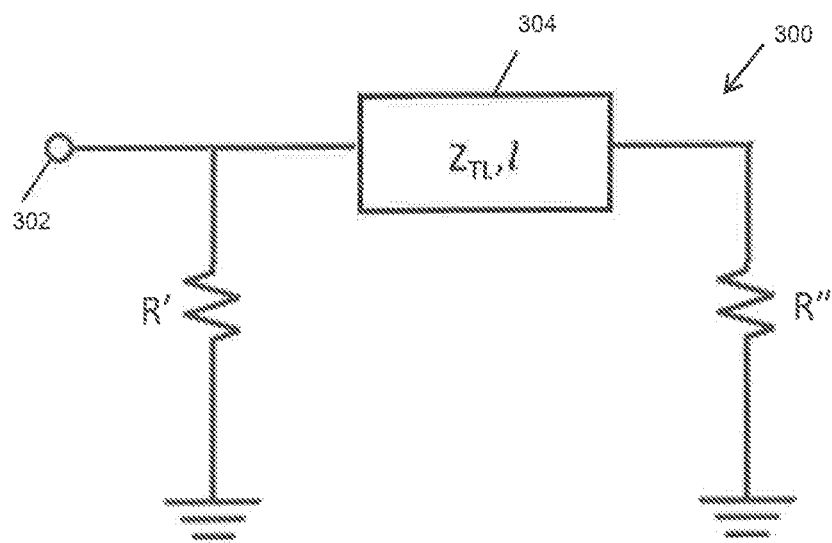
FIG. 4 is a schematic diagram of an equivalent schematic of FIG. 3 in accordance with an aspect of the disclosure.

FIG. 4 is a schematic diagram of an equivalent schematic of FIG. 3 in accordance with an aspect of the disclosure. As shown in FIG. 4, an equivalent circuit 300 includes a transmission line 304 having a characteristic impedance of $Z_{TL}$ and an electrical length l, which is equivalent to the Pi impedance network (i.e. C-L-C network) shown in FIG. 3.

Equation (1) provides how inductance L relates to capacitance C and resistance R as well as frequency ω, where ω=2πF. Equation (2) provides the relationship of the impedance $Z_o$ to L and electric length l.

$$L = \frac{2CR^2}{1 + \omega^2 C^2 R^2} \quad (1)$$

$$\omega L = Z_o \sin\left(\frac{2\pi}{\lambda}l\right) \quad (2)$$

where $Z_o$ is the characteristic impedance $Z_{TL}$.

The transmission line 304 is connected between two resistors R' and R". The transmission line 304 and the resistor R' are also connected to an input port 302. At an RF frequency $F_0$, the Pi impedance network (i.e. C-L-C network) is equivalent to the transmission line 304 having a characteristic impedance of $Z_{TL}$ and an electrical length l. The electrical length or phase length refers to the length of an electrical conductor (e.g. inductor) in terms of a phase shift introduced by transmission over the conductor at a frequency (e.g. $F_0$). The inductance of the inductor L can be selected such that the characteristic impedance of $Z_{TL}$ is equal to the resistance of R", the impedance at the input port 302 is equal to the total resistance from resistors R' and R" connected in parallel, and the parasitic capacitances of $C_P'$ and $C_P''$ are absorbed. When $Z_{TL}$ is equal to R", the electric length l can be any length.

In some variations, the RF frequency can be up to 7 GHz. In some variations, the RF frequency can be up to 6.5 GHz. In some variations, the RF frequency can be up to 6.0 GHz. In some variations, the RF frequency can be up to 5.5 GHz. In some variations, the RF frequency can be up to 5.0 GHz. In some variations, the RF frequency can be up to 4.5 GHz. In some variations, the RF frequency can be up to 4.0 GHz. In some variations, the RF frequency can be up to 3.5 GHz. In some variations, the RF frequency can be up to 7 GHz. In some variations, the RF frequency can be up to 3.0 GHz. In some variations, the RF frequency can be up to 7 GHz. In some variations, the RF frequency can be up to 2.5 GHz. In some variations, the RF frequency can be up to 7 GHz. In some variations, the RF frequency can be up to 2.0 GHz. In some variations, the RF frequency can be up to 1.5 GHz. In some variations, the RF frequency can be up to 1.0 GHz.

Circuit simulations were performed to evaluate return loss performances of the disclosed network termination impedance circuit and the conventional termination impedance circuit. The return loss was determined at the input ports 202 or 302, as shown in FIG. 2 or FIG. 3, respectively. Simulation results are shown in FIGS. 5-6 at an RF frequency $F_0$ of 3.5 GHz and an RF frequency $F_0$ of 6.0 GHz, respectively. The bandwidth of the disclosed Pi network termination impedance circuit 300 was larger than the bandwidth of the conventional termination impedance circuit 200.

The return loss is the loss of power in the signal reflected by a discontinuity in a transmission line. This discontinuity can be a mismatch with the RF termination. The return loss is expressed as a ratio in decibels (dB) in Equations (3) and (4) as follows:

$$RL(dB) = 10\log_{10} P_i / P_r \quad (3)$$

$$RL(dB) = -20\log\left|\frac{Z_{in} - Z_o}{Z_{in} + Z_o}\right| \quad (4)$$

$$Z_{in} = \left(\left(R'' // \left(\frac{1}{j\omega Cp''}\right)\right) + j\omega L\right) // \left(R' // \left(\frac{1}{j\omega Cp'}\right)\right) \quad (5)$$

where RL(dB) is the return loss in dB, $P_i$ is the incident power and $P_r$ is the reflected power, $Z_{in}$ is the termination impedance, and $Z_o$ is the characteristic impedance $Z_{TL}$, as given in Equation (2). In an example of the circuit simulations, an RF frequency F0 was selected to be 3.5 GHz. A resistive film or resistor R had an RF termination resistance of 50 ohm. Also, a parasitic capacitance of CP of 0.4 pF associated with the resistor R was used to achieve the high power.

In the Pi network termination impedance circuit 300, the resistor R was equally split into two resistors R' and R", such that each of R' and R" had a resistance equal to 100 ohm. The parasitic capacitor $C_P$ was also equally split into capacitors $C_P'$ and $C_P''$ such that each of capacitors $C_P'$ and $C_P''$ had a capacitance equal to 0.5 of $C_P$, which was 0.2 pF. The inductance of the inductor L was selected to be 3.35 nH, such that at the frequency $F_0$ of 3.5 GHz, the equivalent transmission line had the characteristic impedance $Z_{TL}$ of 100 ohm. As such, the input impedance of the Pi network termination impedance circuit 300 was 50 ohm, from two resistors R' and R" connected in parallel and having equal values of 100 ohm.

In the conventional termination impedance circuit 200, the inductance of the inductor L was selected to be 1.35 nH, CP was 0.4 pF, and the termination resistance of resistor R was 67 ohm. The total parasitic capacitance of capacitor $C_P$ was equal to the sum of the capacitances of $C_P'$ and $C_P''$, where the capacitance of $C_P'$ was equal to the capacitance of $C_P''$.

FIG. 5 is a graph of return loss versus frequency at a frequency $F_0$ of 3.5 GHz in accordance with an aspect of the disclosure. Dashed curve 502 represents the return loss performance of the conventional termination impedance circuit 200. Solid curve 504 represents the Pi network termination impedance circuit 300. The designed frequency of 3.5 GHz shown at split point 512 of curves 502 and 504, which was at a return loss of −50 decibels (dB).

The bandwidth of the disclosed Pi network termination impedance circuit 300 was larger than the bandwidth of the conventional termination impedance circuit 200. As shown in FIG. 5, the bandwidth at a return loss of 25 dB for the conventional termination impedance circuit 200 (curve 502) extended from 2700 MHz at point 506 of the return loss of 25 dB to 4100 MHz at point 508 of the return loss of 25 dB. In contrast, the bandwidth at a return loss of 25 dB for the Pi network termination impedance circuit 300 represented by solid curve 504 extended from DC to 5000 MHz at point 510 of the return loss of 25 dB, which was larger than the bandwidth of the conventional termination impedance circuit 200.

It will be appreciated by those skilled in the art that the bandwidth may vary with the return loss. For example, when the return loss changes to a return loss of 30 dB, the bandwidth would decrease. When the return loss changes to a return loss of 20 dB, the bandwidth would increase.

When a design frequency $F_0$ is strategically selected, an RF termination can be achieved from DC to a very high frequency. For example, the design frequency can be selected to be 6.0 GHz. FIG. 6 is a graph of return loss versus frequency at a frequency $F_0$ of 6.0 GHz in accordance with an aspect of the disclosure. As shown in FIG. 6, dashed curve 602 represents the return loss performance of the conventional termination impedance circuit 200. Solid curve 604 represents the Pi network termination impedance circuit 300. The design frequency was 6.0 GHz at split point 610 of curve 604, which was at a return loss of −50 dB.

For the Pi network termination impedance circuit 300, when the inductance of the inductor L was selected to be 2.56 nH, with termination resistors R' and R" having equal resistances of 100 ohm, and parasitic capacitors $C_P'$ and $C_P''$ having equal capacitances of 0.2 pF, a bandwidth at a return loss of 25 dB from DC to 7.0 GHz (point 608 on curve 604) was achieved for the Pi network termination impedance circuit 300.

In comparison, for the conventional termination impedance circuit 200, the inductance of the inductor L was selected to be 1 nH, the capacitance of parasitic capacitor $C_P$ was selected to be 0.4 pF, and the resistance of termination resistor R was selected to be 55.7 Ohm. In the conventional termination impedance circuit 200, a bandwidth at a return loss of 25 dB was achieved from DC to 3.5 GHz at point 606 on curve 602.

In some aspects, the termination resistor R can be split into resistors R' and R". One of resistor R' or resistor R" can be split into two termination resistors.

In some aspects, each of termination resistors R' and R" can be split into two termination resistors.

The following examples 1-3 are provided to demonstrate how termination layouts are achieved for various termination impedance circuits including Pi impedance network, i.e. C-L-C network.

Termination Circuit and its Layout Example 1

In some aspects, the termination resistor R can be split into resistors R' and R", as shown in FIG. 7A, and its layout shown in FIGS. 7B and 7C. The input port is near a corner of the dielectric layer.

FIG. 7A is a schematic diagram of a first termination impedance circuit coupled to an input port in accordance with a first aspect of the disclosure. As shown in FIG. 7A, a termination circuit 700 includes two resistors R' and R" with a C-L-C network in between. The C-L-C network includes an inductor L between two capacitors $C_P'$ and $C_P''$. The R' connects to an input port. One end of the inductor L also connects to the input port 706. The inductor L can be approximated by a high impedance transmission line.

FIG. 7B is a top view of a termination circuit layout of FIG. 7A in accordance with an aspect of the disclosure. As shown in FIG. 7B, in a top view 700A of the termination circuit layout for the termination circuit 700, a resistive film is split into two resistive film patches 712A and 712B with a tuning line 704 in between. The tuning line 704 is formed of a conductive material and corresponding to the inductor L in FIG. 7A. The two resistive film patches 712A and 712B correspond to resistors R' and R", respectively, such that a termination resistor R is split into two termination resistors R' and R".

The resistor R" is connected to a ground 702B or a plated edge including a connection via 722 on a lower left edge of the dielectric layer 716, while the resistor R' is connected to a ground 702A or a plated edge including a connection via 722 on an upper right edge of the dielectric layer 716. The resistor R' is also connected to an input port 706 which connects to a lower end of the tuning line 704. The input port 706 is a plated edge including a connection via 722 or a plated strip near the edge. The resistor R" is also connected to a conductive strip 708 that is connected an upper end of the tuning line 704.

The conductive strip 708 is on an opposite side of the resistive film R" to the ground 702B. The input port 706 is on opposite side of the resistive film R' to the ground 702A. The resistive film patches 712A-B, the tuning line 704, the grounds 702A-B, the conductive strip 708, and the input port 706 are disposed over a dielectric layer 716.

FIG. 7C is a bottom view of the termination circuit layout of FIG. 7B in accordance with an aspect of the disclosure. This view is a mirror view of FIG. 7B looking up from the bottom. As shown in FIG. 7C, in a bottom view 700B of the termination circuit layout for the termination circuit 700, the input port 706 is positioned near a lower right corner. Area 710 may include a layer of a conductive material, which provides grounding. In some aspects, the area 710 may also be used to attach to a heat sink in a SMT case.

Figures 7D, 7E:
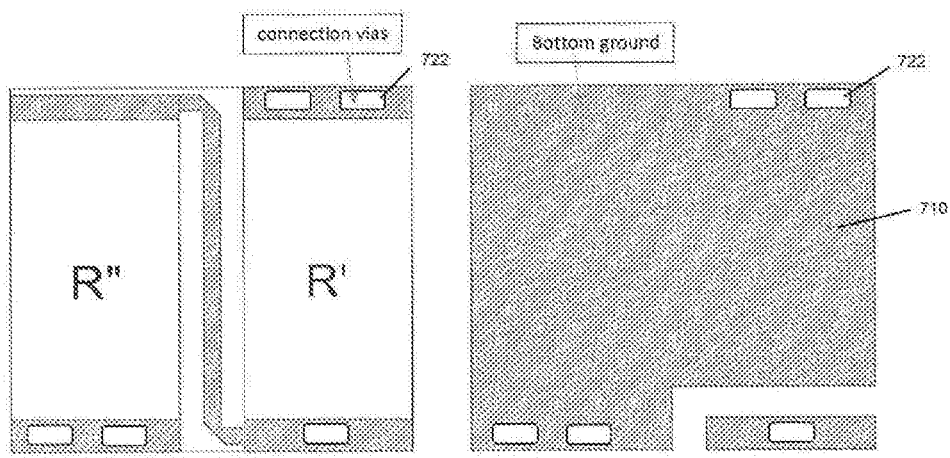
FIG. 7D is a top view of an alternative termination circuit layout of FIG. 7A in accordance with an aspect of the disclosure.
FIG. 7E is a bottom view of the alternative termination circuit layout of FIG. 7D in accordance with an aspect of the disclosure.

FIG. 7D is a top view of an alternative termination circuit layout of FIG. 7A in accordance with an aspect of the disclosure. FIG. 7E is a bottom view of the alternative termination circuit layout of FIG. 7D in accordance with an aspect of the disclosure. As shown in FIGS. 7D and 7E, connection vias 722 may be formed in the plated edges 702A-B and 706 to connect the top layer to the bottom layer. In some variations, the conductive material or the conductive strips may include a conductive metal, such as copper, gold, silver, aluminum, among others.

Termination Circuit and its Layout Example 2

In some aspects, the termination resistor R can be split into resistors R' and R". One of resistor R' or resistor R" can be split into two termination resistors, as shown in FIG. 8B. For example, resistor R" can be split into resistors $R_1''$ and $R_2''$. Alternatively, resistor R' can be split into resistors $R_1'$ and $R_2'$. As such, a symmetrical layout can be formed with an input port at the center of the termination impedance circuit, as shown in FIGS. 8B and 8C. This layout with the input port at the center may sometimes provide convenience.

FIG. 8A is a schematic diagram of a center-fed network termination impedance circuit coupled to an input port in accordance with a second aspect of the disclosure. In the structure 800, resistor R" is split into two parallel termination resistors $R_1''$ and $R_2''$ with two inductors $L_1$ and $L_2$ in between, so that the termination impedance circuit can be fed from the center as shown in FIGS. 8B and 8C. Using the layout from FIGS. 7A-C as a reference, in the structure 800, $R_1''$ is equal to $R_2''$, which is equal to 2*R", $C_{P1}''$ is equal to $C_{P2}''$, which is equal to 0.5*$C_P''$, and $L_1$ is equal to $L_2$, which is equal to 0.5*L. R' and $C_P'$ are the same as the Pi network termination circuit 700.

FIG. 8B is a top view of a center-fed termination circuit layout of FIG. 8A in accordance with an aspect of the disclosure. As shown in FIG. 8B, in a top view 800A of the termination circuit layout for the termination circuit 800, a resistive film is split into three resistive film patches 812A, 812B, and 812C with two tuning lines 804A-B.

One tuning line 804A corresponding to inductor $L_1$ in FIG. 8A is between resistive film patches 812A and 812C, and another tuning line 804B corresponding to inductor $L_2$ in FIG. 8A is between resistive film patches 812B and 812C. The tuning lines 804A-B are formed of a conductive material.

The resistive film patches 812A and 812B have the same area, while the resistive film patch 812C between the resistive film patches 812A and 812B has twice the area of the resistive film patches 812A and 812B corresponding to resistors $R_1"$ and $R_2"$, respectively. As such, a termination resistor R split into two termination resistors R', $R_1"$, and $R_2"$.

The resistor $R_1"$ is connected to a ground 802A or a plated edge including a connection via 822 on a lower left edge of the dielectric layer, while the resistor $R_2"$ is connected to a ground 802B or a plated edge including a connection via 822 on a lower right edge of the dielectric layer. The resistor R' is connected to an input port 806 at a center of a bottom edge of the dielectric layer, which connects to a lower end of the tuning line 804A and a lower end of the tuning line 804B. The input port 806 is a plated edge including a connection via 822 or a plated strip near the edge. The resistor R' is also connected to a ground 802C or a plated edge including a connection via 722 near a center of a top edge of the dielectric layer. The resistor $R_1"$ is also connected to a conductive strip 808A near an upper left edge of the dielectric layer. The conductive strip 808A is connected an upper end of the tuning line 804A. The resistor $R_2"$ is also connected to a conductive strip 808B near an upper right edge of the dielectric layer. The conductive strip 808B is connected an upper end of the tuning line 804B.

The conductive strip 808A is on an opposite side of the resistive film patch 812A or resistor $R_1"$ to the ground 802A, the input port 806 is on opposite side of the resistive film patch 812C or resistor R' to the ground 802C, and the conductive strip 808B is on an opposite side of the resistive film patch 812B or resistor $R_2"$ to the ground 802B. The resistive film patches 812A-C, the tuning lines 804A-B, the grounds 802A-B, the conductive strips 808A-B, and the input port 806 are disposed over a dielectric layer 816.

FIG. 8C is a bottom view of the center-fed termination circuit layout of FIG. 8B in accordance with an aspect of the disclosure. This view is a mirror view of FIG. 8B looking up from the bottom. As shown in FIG. 8C, in a bottom view 800B of the termination circuit layout for the termination circuit 800, the input plated edge including a connection via 806 is near the lower center. Area 810 may include a layer of conductive material, which provides grounding. In some aspects, the area 810 may also be used to attach to a heat sink in a SMT case.

Figure 8D:
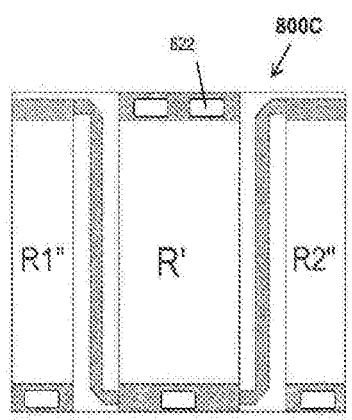
FIG. 8D is a top view of an alternative termination circuit layout of FIG. 8A in accordance with an aspect of the disclosure.
Figure 8E:
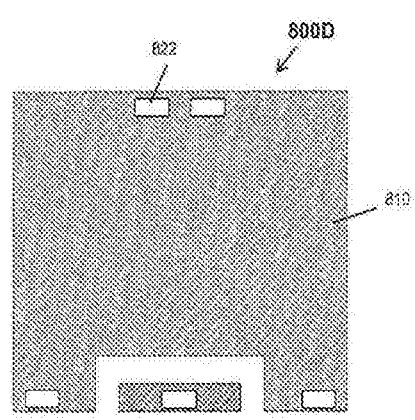
FIG. 8E is a bottom view of the alternative termination circuit layout of FIG. 8D in accordance with an aspect of the disclosure.

FIG. 8D is a top view of an alternative termination circuit layout of FIG. 8A in accordance with an aspect of the disclosure. FIG. 8E is a bottom view of the alternative termination circuit layout of FIG. 8D in accordance with an aspect of the disclosure. As shown in FIGS. 8D and 8E, connection vias 822 may be formed in the plated edges 802A-C and 806 to connect the top layer to the bottom layer.

In some variations, the conductive material or the conductive strips may include a conductive metal, such as copper, gold, silver, aluminum, among others. In some variations, copper can be plated over the dielectric layer.

Termination Circuit and its Layout Example 3

Figure 9B:
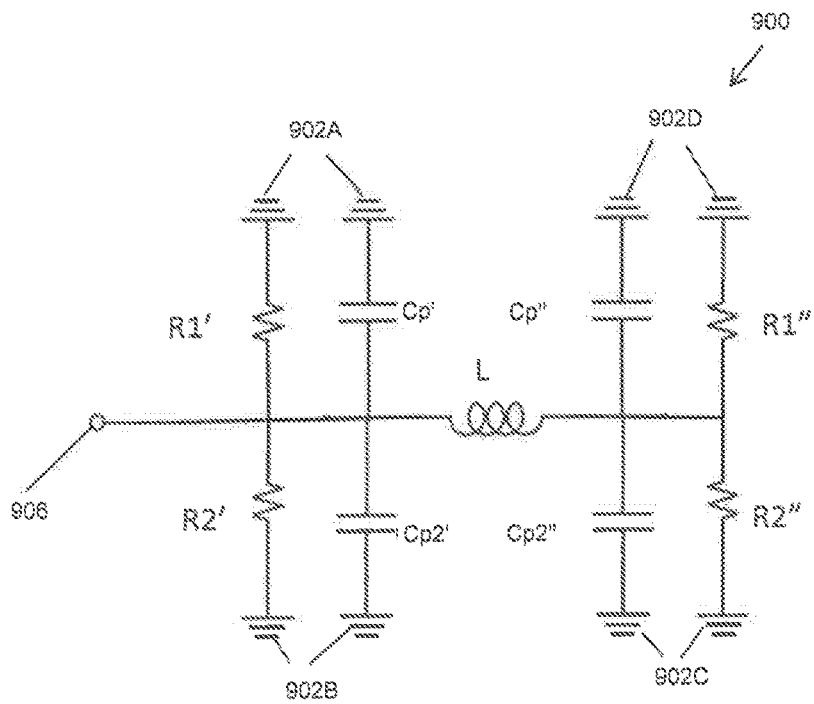
FIG. 9B is a top view of a center-fed termination circuit layout of FIG. 9A in accordance with an aspect of the disclosure.
Figure 9C:
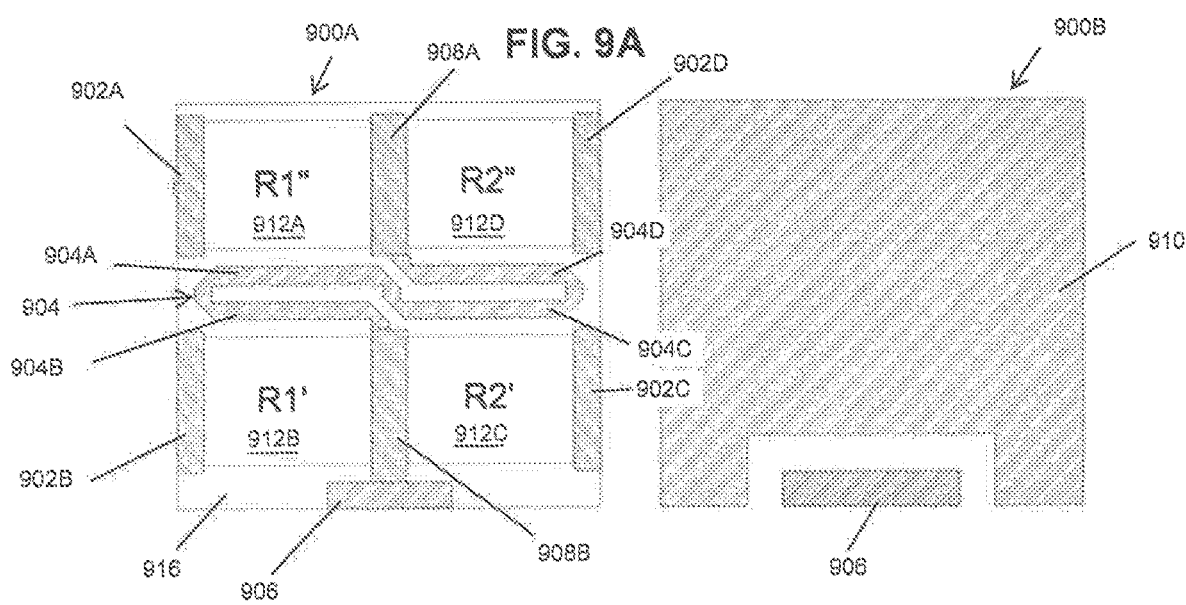
FIG. 9C is a bottom view of the center-fed termination circuit layout of FIG. 9B in accordance with an aspect of the disclosure.

In some aspects, each of termination resistors R' and R" can be split into two termination resistors, e.g. $R_1'$ and $R_2'$ and $R_1"$ and $R_2"$, as shown in FIG. 9A, so that a symmetrical layout can be formed with an input port at the center of the termination impedance circuit, as shown in FIGS. 9B and 9C.

FIG. 9A is a schematic diagram of another center-fed network termination impedance circuit coupled to an input port in accordance with a third aspect of the disclosure. As shown in FIG. 9A, termination resistor R' is divided into two resistive patches having resistors $R_1'$ and $R_2'$ that are connected in parallel. The termination resistor $R_2"$ is divided into two resistive patches having resistors $R_1"$ and $R_2"$ that are connected in parallel. In the configuration 900, $R_1'=R_2'=2*R'$, $R_1"=R_2"=2*R"$, $C_{P1}'=C_{P2}'=0.5*C_P'$, $C_{P1}"=C_{P2}"=0.5*C_P"$. Inductor L is the same as the termination impedance circuit 700 shown in FIG. 7A. In this configuration 900, each of termination resistors R' and R" is divided into two resistors, with a tuning line or inductor L in between when using the layout 700 from FIG. 7 as a reference.

FIG. 9B is a top view of a center-fed termination circuit layout of FIG. 9A in accordance with an aspect of the disclosure. As shown in FIG. 9B, in a top view 900A of the termination circuit layout for the termination circuit 900, a resistive film is split into four resistive film patches 912A, 912B, 912C, and 912D, with a tuning line 904. The resistive film patches 912A, 912B, 912C, and 912D have the same area, and correspond to resistors $R_1"$, $R_1'$, $R_2'$, and $R_2"$ in FIG. 9A, respectively. As such, a termination resistor R split into two termination resistors R', and R", where R' is split into $R_1'$ and $R_2'$, and R" is split into $R_1"$ and $R_2"$.

The tuning line 904 is formed of a conductive material and corresponds to the inductor L in FIG. 9A. The tuning line 904 has a first portion including segments 904A and 904B between resistive film patches 912A and 912B. The first portion may include two segments 904A and 904B that are parallel to each other and connected with each other near the outside left edge to form a U-shape. The tuning line 904 also has a second portion including segments 904C and 904D between resistive film patches 912C and 912D. The second portion may include two segments 904C and 904D that are parallel to each other and connected with each other near the outside right edge to form a U-shape. The segment 904A connects to the segment 904C near the middle.

The resistor $R_1"$ is connected to a ground 902A or a plated edge including a connection via 922 on an upper left edge of the dielectric layer 916, while the resistor $R_1'$ is connected to a ground 902B or a plated edge including a connection via 922 on a lower left edge of the dielectric layer 916. The resistor $R_2"$ is connected to a ground 902D or plated edge including a connection via 922 on the upper right edge, while the resistor $R_2'$ is connected to a ground 902C or a plated edge including a connection via 922 on a lower right edge of the dielectric layer 916.

The resistor $R_1'$ and $R_2'$ are connected to an input port 906 at the center of the bottom edge of the dielectric layer 916, which connects to a lower end of the tuning line 904 through a conductive strip 908B. The input port 906 is a plated edge including a connection via 922 or a plated strip near the edge. The resistor $R_1"$ and $R_2"$ are also connected to a conductive strip 908A between the upper resistive film patches 912A and 912D. The conductive strip 908A is connected an upper end of the tuning line 904, i.e. the end of segment 904D. The resistor $R_1'$ and R2' are also connected to the conductive strip 908B between lower resistive film patches 912B and 912C. The conductive strip 908B is connected to a lower end of the tuning line 804, i.e. the end of segment 904B.

The conductive strip 908A is between the resistive film patches 912A for resistor $R_1"$ and 912D for resistor $R_2"$. The conductive strip 908B is between the resistive film patches 912B for resistor $R_1'$ and 912C for resistor $R_2'$. The conductive strip 908A is on an opposite side of the resistive film patch 912A or resistor $R_1"$ to the ground 902A, and the conductive strip 908B is on an opposite side of the resistive film patch 912B or resistor $R_1'$ to the ground 902B. The conductive strip 908A is also on an opposite side of the resistive film patch 912D or resistor $R_2$" to the ground 902D, and the conductive strip 908B is on an opposite side of the resistive film patch 912C $R_2$' to the ground 902C. The resistive film patches 912A-D, the tuning line 904, the grounds 902A-D, the conductive strips 908A-B, and the input port 906 are disposed over a dielectric layer 916.

FIG. 9C is a bottom view of the center-fed termination circuit layout of FIG. 9B in accordance with an aspect of the disclosure. This view is a mirror view of FIG. 9B looking up from the bottom. As shown in FIG. 9C, in a bottom view 900B of the termination circuit layout for the termination circuit 900, the input plated edge 906 including a connection via 922 is near the lower center. Area 910 may include is a layer of conductive material, which provides grounding. In some aspects, the area 910 may also be used to attach to a heat sink in a SMT case.

Figures 9D, 9E:
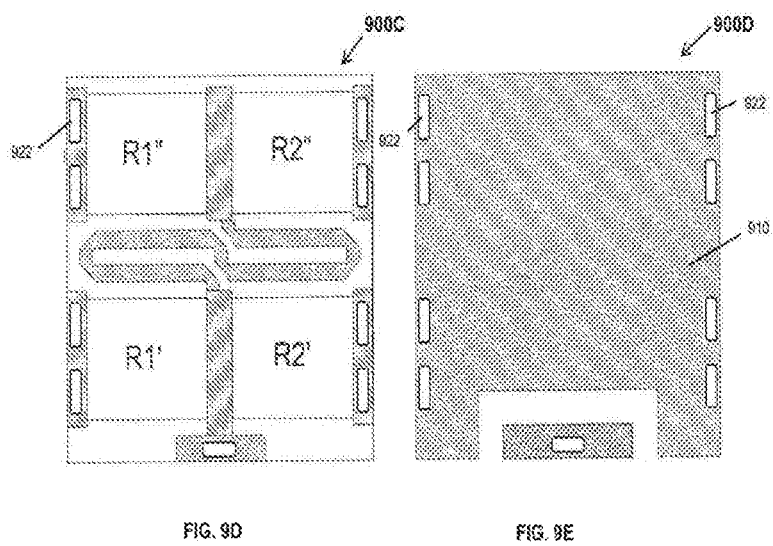
FIG. 9D is a top view of an alternative termination circuit layout of FIG. 9A in accordance with an aspect of the disclosure.
FIG. 9E is a bottom view of the alternative termination circuit layout of FIG. 9D in accordance with an aspect of the disclosure.

FIG. 9D is a top view of an alternative termination circuit layout of FIG. 9A in accordance with an aspect of the disclosure. FIG. 9E is a bottom view of the alternative termination circuit layout of FIG. 9D in accordance with an aspect of the disclosure. As shown in FIGS. 9D and 9E, connection vias 922 may be formed in the plated edges 902A-D and 906 to connect the top layer to the bottom layer.

In some variations, the conductive material or the conductive strips may include a conductive metal, such as copper, gold, silver, aluminum, among others. In some variations, copper can be plated over the dielectric layer. In some aspects, the disclosed termination circuits can be applied to either SMT or flange mount.

Having described several aspects, it will be recognized by those skilled in the art that various modifications, alternative constructions, and equivalents may be used without departing from the spirit of the disclosure. Additionally, a number of well-known processes and elements have not been described in order to avoid unnecessarily obscuring the aspects disclosed herein. Accordingly, the above description should not be taken as limiting the scope of the document.

Those skilled in the art will appreciate that the presently disclosed aspects teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the method and system, which, as a matter of language, might be said to fall there between.

What is claimed is:

1. A wideband termination circuit layout for high power applications, the circuit comprising:
    a dielectric layer having a first surface and a second surface;
    at least two resistive film patches disposed over the first surface of the dielectric layer; and
    a tuning line between the at least two resistive films disposed over the first surface of the dielectric layer, wherein the at least two resistive film patches are connected in series with the at least one tuning line, wherein the at least two resistive film patches have a first end connected to a first ground and a second ground, respectively.

2. The circuit layout of claim 1,
    wherein a first patch of the at least two resistive film patches has a second end connected to an input port disposed over the first surface,
    wherein the input port is connected to a first end of the at least one tuning line,
    wherein a second patch of the at least two resistive film patches has a second end connected with a second end of the at least one tuning line.

3. The circuit layout of claim 1,
    wherein the input port and the second ground are conductive strips disposed over a first portion and a second portion of a first edge of the dielectric layer,
    wherein the first ground is a conductive strip disposed over a second edge of the dielectric layer,
    wherein the second edge is opposite to the first edge,
    wherein the input port is opposite to the first ground.

4. The circuit layout of claim 2, wherein the wideband termination circuit layout has a bandwidth at a return loss of 25 dB from DC to 7.0 GHz at the RF frequency $F_0$ of 6.0 GHz.

5. The circuit layout of claim 2,
    wherein the at least one tuning line has an inductance of 2.56 nH,
    wherein the first and second patches of the at least two resistive film patches have a resistance of 100 ohms,
    wherein the first and second patches of the at least two resistive film patches associated with a respective first and second parasitic capacitors have a capacitance of 0.2 pF.

6. The circuit layout of claim 1, wherein the at least two resistive film patches comprise four resistive film patches disposed over the first surface of the dielectric layer.

7. The circuit layout of claim 6, wherein the at least one tuning line is connected to each of the four resistive film patches.

8. The circuit layout of claim 7, wherein the at least one tuning line is arranged substantially parallel to a first edge of the dielectric layer, wherein the input port is positioned near a center of the first edge, and connected to the at least one tuning line.

9. The circuit layout of claim 8, wherein each of the four resistive film patches has a ground or a plated edge including at least one connection via substantially perpendicular to the first edge.

10. The circuit layout of claim 1, wherein the at least two resistive film patches comprise three resistive film patches disposed over the first surface of the dielectric layer.

11. The circuit layout of claim 10,
    wherein a first patch of the three resistive film patches is disposed in the middle of the first surface of the dielectric layer,
    wherein the first patch of the three resistive film patches has a first end connecting to the input port and a second end connecting to a first ground,
    wherein the first ground is a conductive strip disposed over a first edge of the dielectric layer.

12. The circuit layout of claim 11,
    wherein a second patch and a third patch of the three resistive film patches are disposed on each side of the first of the three resistive film patches,
    wherein each of the second and third patches of the three resistive film patches is connected to a respective second ground and a third ground,
    wherein the second ground and the third ground are conductive strips disposed over a second edge of the dielectric layer, wherein the second edge is opposite to the first edge.

13. The circuit layout of claim 12,
    wherein the at least one tuning line comprises a first tuning line and a second tuning line in parallel with the first tuning line, wherein the second patch of the three resistive film patches is connected to the first tuning line, wherein the third patch of the three resistive film patches is connected to the second tuning line.

14. The circuit layout of claim 13, wherein the input port is connected to the first tuning line and the second tuning line, wherein the input port is disposed over a center of the second edge between the second and third grounds.

15. A termination device comprising the circuit layout of claim 1 and a heat sink attached to the second surface of the dielectric layer.

16. A wideband termination circuit for high power applications, the circuit comprising:
- a first termination resistor having a first end and a second end;
- a second termination resistor having a first end and a second end;
- a Pi impedance network or C-L-C network equivalent to an equivalent transmission line with a characteristic impedance $Z_{TL}$, and an electric length l, wherein the equivalent transmission line is connected between the first end of first termination resistor and the first end of the second termination resistor, wherein the equivalent transmission line is connected to the input port, wherein the characteristic impedance $Z_{TL}$ is equal to the resistance of the second termination resistor at an RF frequency $F_0$.

17. The circuit of claim 16, wherein the Pi impedance network comprises a first capacitor and a second capacitor, and an inductor connected between the first and second capacitors in series.

18. The circuit of claim 17, wherein the wideband termination circuit has a bandwidth at a return loss of 25 dB from DC to 7.0 GHz at the RF frequency $F_0$ of 6.0 GHz.

19. The circuit of claim 16, wherein the first end of the first termination resistor connects to an input port, the second end of the first termination resistor connects to a first ground, the second end of the second termination resistor connects to a second ground.

* * * * *